United States Patent [19]
Klomsdorf et al.

[11] Patent Number: 6,160,449
[45] Date of Patent: Dec. 12, 2000

[54] POWER AMPLIFYING CIRCUIT WITH LOAD ADJUST FOR CONTROL OF ADJACENT AND ALTERNATE CHANNEL POWER

[75] Inventors: Armin Klomsdorf, Spring Grove; William Alberth, Crystal Lake; Luke Winkelmann, Mundelein, all of Ill.

[73] Assignee: Motorola, Inc., Schaumburg, Ill.

[21] Appl. No.: 09/358,884

[22] Filed: Jul. 22, 1999

[51] Int. Cl.[7] .............................. H03F 1/26; H03F 1/30; H04K 1/02; H04L 25/03
[52] U.S. Cl. ........................ 330/149; 330/279; 375/296; 375/297
[58] Field of Search .................... 330/129, 149, 330/279; 375/296, 297

[56] References Cited

U.S. PATENT DOCUMENTS

| | | | |
|---|---|---|---|
| 4,041,395 | 8/1977 | Hill | 325/133 |
| 4,147,985 | 4/1979 | Rogers | 325/144 |
| 4,165,493 | 8/1979 | Harrington | 330/207 P |
| 4,348,644 | 9/1982 | Kamiya | 330/297 |
| 4,356,458 | 10/1982 | Armitage | 333/17 M |
| 4,370,622 | 1/1983 | Hornbeck et al. | 330/207 P |
| 4,442,407 | 4/1984 | Apel | 330/128 |
| 4,546,313 | 10/1985 | Moyer | 324/103 P |
| 4,647,871 | 3/1987 | Turner, Jr. | 330/298 |
| 4,827,219 | 5/1989 | Harrison | 324/322 |
| 4,890,062 | 12/1989 | Haragashira | 324/322 |
| 4,924,191 | 5/1990 | Erb et al. | 330/130 |
| 4,985,686 | 1/1991 | Davidson et al. | 330/124 R |
| 4,990,866 | 2/1991 | Martheli | 331/99 |
| 4,994,757 | 2/1991 | Bickley et al. | 330/285 |
| 5,060,294 | 10/1991 | Schwent et al. | 455/93 |
| 5,101,172 | 3/1992 | Ikeda et al. | 330/136 |
| 5,113,414 | 5/1992 | Karam et al. | 375/60 |
| 5,170,496 | 12/1992 | Viereck | 455/121 |
| 5,195,045 | 3/1993 | Keane et al. | 364/482 |
| 5,220,276 | 6/1993 | Kleefstra | 324/103 P |
| 5,251,330 | 10/1993 | Chiba et al. | 455/91 |
| 5,276,912 | 1/1994 | Siwiak et al. | 455/73 |
| 5,278,997 | 1/1994 | Martin | 455/127 |
| 5,300,894 | 4/1994 | Myer et al. | 330/129 |
| 5,302,914 | 4/1994 | Arntz et al. | 330/129 |
| 5,329,244 | 7/1994 | Fujita et al. | 330/149 |
| 5,339,041 | 8/1994 | Nitardy | 330/10 |
| 5,351,016 | 9/1994 | Dent | 332/103 |
| 5,361,403 | 11/1994 | Dent | 455/74 |
| 5,408,691 | 4/1995 | Takao | 455/127 |
| 5,420,536 | 5/1995 | Faulkner et al. | 330/149 |
| 5,428,828 | 6/1995 | Pugel et al. | 455/191.2 |
| 5,483,680 | 1/1996 | Talbot | 455/107 |
| 5,564,086 | 10/1996 | Cygan et al. | 455/126 |
| 5,589,796 | 12/1996 | Alberth, Jr. et al. | 330/133 |
| 5,598,127 | 1/1997 | Abbiati et al. | 330/149 |
| 5,640,691 | 6/1997 | Davis et al. | 455/126 |
| 5,673,001 | 9/1997 | Kim et al. | 330/284 |
| 5,742,201 | 4/1998 | Eisenberg et al. | 330/2 |

FOREIGN PATENT DOCUMENTS

065936A2  12/1995  European Pat. Off. .

*Primary Examiner*—Michael B Shingleton
*Attorney, Agent, or Firm*—Paul J. Bartusiak

[57] ABSTRACT

A power amplifying circuit with load adjust for control of adjacent and alternate channel power. A power amplifier amplifies an input signal to produce an amplified signal. A variable impedance network presents different impedances to the output of the power amplifier responsive to a load control signal. A peak-to-average detector provides an indication of a peak-to-average ratio of the amplified signal. A controller coupled to the peak-to-average detector and the variable impedance network produces the load control signal responsive to the indication of the peak-to-average ratio.

21 Claims, 6 Drawing Sheets

POWER AMPLIFYING CIRCUIT WITH LOAD ADJUST FOR CONTROL OF ADJACENT AND ALTERNATE CHANNEL POWER

CROSS REFERENCE TO RELATED APPLICATION

This application is related to co-pending U.S. patent applications Ser. No. 09/359,586 filed herewith by Alberth et al. and entitled "LOAD ENVELOPE FOLLOWING AMPLIFIER SYSTEM," Ser. No. 09/359,225 filed herewith by David Schlueter and entitled "POWER AMPLIFYING CIRCUIT WITH SUPPLY ADJUST TO CONTROL ADJACENT AND ALTERNATE CHANNEL POWER," Ser. No. 09/358,674 filed herewith by Klomsdorf et al. and entitled "MEMORY-BASED AMPLIFIER LOAD ADJUST SYSTEM," and Ser. No. 09/358,280 filed herewith by Alberth et al. and entitled "LOAD ENVELOPE ELIMINATION AND RESTORATION AMPLIFIER STEM."

FIELD OF THE INVENTION

This invention generally relates to power amplifiers. More specifically, this invention relates to a power amplifier circuit for improving efficiency and adjacent channel power.

BACKGROUND OF THE INVENTION

The power amplifier is a key technology in portable radiotelephone design. In cellular telephones, the power amplifier has a large impact on the available talk time. This is because the power amplifier consumes a significant amount of power relative to the other circuitry within the cellular telephone. One parameter defining how much power the power amplifier consumes is the power amplifier efficiency.

Power amplifiers whose DC supply voltages are continuously varied to match signal level requirements for improving efficiency throughout a predetermined range of input signal levels are generally known. One such example is disclosed in U.S. Pat. No. 4,442,407 entitled, "TWO LOOP AUTOMATIC LEVEL CONTROL FOR POWER AMPLIFIER", issued to Thomas R. Apel on Jun. 11, 1982. In '407 the power amplifier is operated with improved efficiency by modulation of the RF amplifier DC supply voltage in response to a comparison between a signal, corresponding to the weighted sum of the magnitude of the power amplifier load current and supply voltage, and the amplitude of the modulation signal.

The system disclosed in '407, however, does nothing to address another important performance parameter of power amplifiers used for cellular telephone systems-transmitted adjacent and alternate channel power. In cellular telephone systems, the radiated adjacent channel power can cause interference in other cellular channels, thus causing a degradation in overall system performance. The adjacent and alternate channel power parameters are even more critical in cellular systems employing linear modulation schemes such as Interim Standard (IS)-136 Time Division Multiple Access (TDMA) and IS-95 Code Division Multiple Access (CDMA). By optimizing the power amplifier for efficiency with no regard to adjacent and alternate channel power performance, the power amplifier can fail the adjacent and alternate channel power specifications for a particular cellular system.

A method to simultaneously increase the linearity and efficiency of power amplifiers is disclosed in U.S. Pat. No. 5,101,172 entitled, "LINEAR AMPLIFIER", issued to Yukio Ikeda, et al., on Dec. 1, 1990. In '172 the drain voltage is controlled by a DC/DC converter to follow the amplitude level of the output signal. This increases power amplifier efficiency but introduces amplitude modulation (AM) and phase modulation (PM) distortion. Input and output envelope detectors are thus employed in conjunction with phase and amplitude comparators in order to introduce predistortion to counteract the distortion introduced by the power amplifier. This system requires accurate tracking of the power amplifier distortion, which can be difficult. In addition, the multiple couplers and phase/amplitude compare circuitry adds size and cost when used in a portable cellular telephone.

Another technique to minimize power amplifier distortion is disclosed in U.S. Pat. No. 4,348,644 entitled "POWER AMPLIFYING CIRCUIT WITH CHANGING MEANS FOR SUPPLY VOLTAGE," issued to Shingo Kamiya on Mar. 24, 1980. In '644 a power amplifying circuit detects the crest factor (e.g. peak-to-average ratio) of the output signal of a power amplifier. When the crest factor is large, the power amplifier supply voltage is raised. Conversely, when the crest factor is small, the supply voltage is lowered. Thus, when more power amplifier supply voltage is needed to handle to handle the high peak-to-average ratio, the supply voltage is raised. Conversely, when there is a small peak-to-average ratio, the supply voltage is lowered. The high peaks are thus faithfully reproduced by raising the supply voltage, and the power loss is reduced by raising and lowering the power amplifier supply voltage as necessary.

The '644 technique is useful in electronic systems to amplify musical signals. In this type of application, faithful reproduction of the musical signal is necessary in order to provide for acceptable fidelity. However, the '644 technique does not address the need for trading off fidelity versus efficiency in a manner necessary to provide for cost effective and highly efficient portable radiotelephones.

Accordingly, there is a need for power amplifier with more accurate and comprehensive control of the adjacent and alternate channel power transmitted by the power amplifier. There is a further need for the power amplifier to operate efficiently for linear modulation schemes. A method of trading off linearity and efficiency is needed for power amplifiers used in portable radiotelephones. There is also a need to control power amplifier adjacent channel power, alternate channel power, and efficiency performance by compensating for part-to-part variations present in portable radiotelephones. There is also a need to control the power amplifier average transmit power while controlling the power amplifier linearity and efficiency.

DETAILED DESCRIPTION OF PREFERRED EMBODIMENTS

Figure 1:
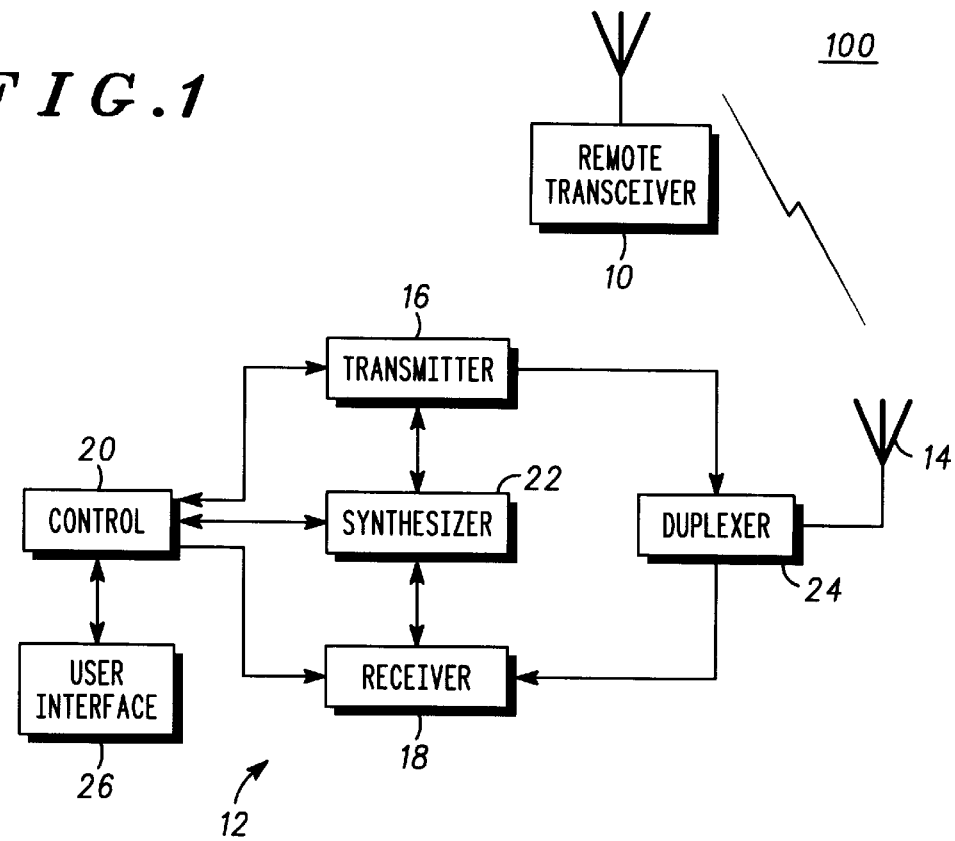
FIG. 1 is a block diagram of a radiotelephone having a receiver and a transmitter.

FIG. 1 is an illustration in block diagram form of a radiotelephone communication system 100. The radiotelephone communication system 100 includes a remote transceiver 10 and one or more radiotelephones such as portable radiotelephone 12. The remote transceiver 10 sends and receives RF signals to and from the portable radiotelephone 12 within a designated geographic area.

The portable radiotelephone 12 includes an antenna 14, a transmitter 16, a receiver 18, a control block 20, a synthesizer 22, a duplexer 24, and a user interface 26. To receive information, the portable radiotelephone 12 detects RF signals containing data through the antenna 14 and produces detected RF signals. The receiver 18 converts the detected RF signals into electrical baseband signals, demodulates the electrical baseband signals, recovers the data, including automatic frequency control information, and outputs the data to the control block 20. The control block 20 formats the data into recognizable voice or data information for use by the user interface 26.

Typically the user interface 26 includes a microphone, a speaker, a display, and a keypad. The user interface 26 is for receiving user input information and presenting received data that was transmitted by remote transceiver 10. The receiver 18 includes circuitry such as low noise amplifiers, filters, down conversion mixers and quadrature mixers, and automatic gain control circuitry, all known in the art.

To transmit RF signals containing information from the portable radiotelephone 12 to the remote transceiver 10, the user interface 26 directs user input data to the control block 20. The control block 20 typically includes any of a DSP core, a microcontroller core, memory, clock generation circuitry, software, and an output power control circuit. The control block 20 formats the information obtained from the user interface 26 and conveys it to the transmitter 16 for conversion into RF modulated signals. The transmitter 16 conveys the RF modulated signals to the antenna 14 for transmission to the remote transceiver 10. Thus, the transmitter 16 is for transmitting a modulated information signal. The duplexer provides isolation between the signals transmitted by the transmitter 16 and received by the receiver 18.

The portable radiotelephone 12 is operable over a predetermined band of frequencies. The synthesizer 22 provides the receiver 18 and the transmitter 16 with signals, tuned to the proper frequency, to allow the reception and transmission of information signals. Control over functions of the receiver 18 and the transmitter 16, such as channel frequency, is provided by the control block 20. Thus, the control block 20 provides the synthesizer 22 program instructions for frequency synthesis.

Experiments with a prototype power amplifier were initially performed to determine whether the transmitted peak-to-average ratio of the signal produced by the transmitter 16 can be used to predict adjacent channel power and alternate channel power. Adjacent channel power is defined as the amount of power in a designated bandwidth transmitted in a channel immediately adjacent to the channel that the transmitter 16 is currently operating. Alternate channel power is defined as the amount of power in a designated bandwidth transmitted in a channel that is two channels beyond the transmitter 16 channel of operation.

For example, in the IS-95 CDMA cellular telephone system, the transmitter can be operating at 836 MHz. The adjacent channel would be 836 MHz+/−885 KHz, and the alternate channel would be 836 MHz+/−1.98 MHz.

Figure 2:
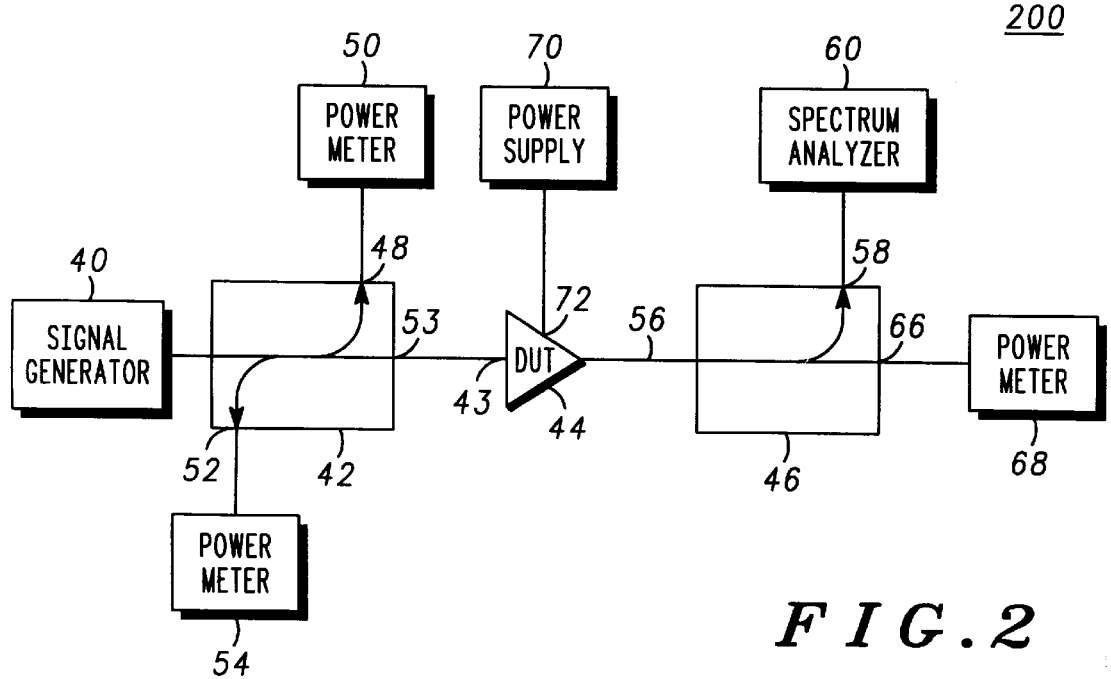
FIG. 2 is a block diagram of a test setup used to conduct the peak-to-average ratio experiments.

FIG. 2 is a block diagram of a test setup 200 used to conduct the peak-to-average ratio experiments. The test setup 200 includes a signal generator 40 coupled through a bi-directional coupler 42 to the input of the power amplifier device under test (DUT) 44. The output 56 of the DUT 44 is connected to coupler 46.

The signal generator 40 produces an RF input signal. A portion of the input signal is coupled to port 48 and measured with power meter 50. The remainder of the RF input signal produced at bidirectional coupler output 53 is applied to the DUT 44. The portion of the RF input signal that is reflected at the input 43 of the DUT is coupled to port 52 where it is measured via power meter 54. The measurements made with power meter 50 and power meter 54 allow for the measurement of input return loss of the DUT 44.

The RF input signal is amplified by the DUT 44 to produce an amplified signal at DUT output 56, and the amplified signal is applied to coupler 46. A portion of the amplified signal is coupled via port 58 to spectrum analyzer 60. With the spectrum analyzer 60 the adjacent channel power and the alternate channel power of the amplified signal can be measured with respect to the power at the channel of operation. The remainder of the amplified signal is produced at coupler output 66, and the peak and average powers are measured via power meter 68.

Power supply 70 provides a controllable supply voltage to the supply port 72 of the DUT 44. For test purposes, the frequency of operation is set to 836 MHz, and the signal generator 40 varies the power of the RF input signal from −9 dBm to +7 dBm in 1 dB increments. With the input power increasing at 1 dB increments, the average power of the amplified signal produced at DUT output 56 is held constant by adjusting the supply voltage applied to the DUT 44 (e.g. here the drain voltage of the FET device of the DUT 44). In other words, the supply voltage of the DUT 44 is adjusted to adjust the gain of the DUT 44, thereby obtaining a constant average output power for different input power levels.

The signal generator 40 produces an input signal that has modulation to create a complex input signal characterized by an average power and a peak power that depends upon the modulation scheme used. In the illustrated embodiment, the modulation scheme is that used in the IS-95 CDMA cellular telephone system-offset quadrature phase shift keying (OQPSK) modulation with baseband filtering as is known in the art. This modulation scheme produces a maximum, instantaneous peak-to-average ratio of 5.2 dB. Throughout the specification, the term peak-to-average ratio is understood to mean peak-to-average power ratio. However, peak-to-average ratio of voltage levels could be used without use of the inventive faculty.

At each input power level, the adjacent and alternate channel power emissions are measured via spectrum analyzer 60. The supply voltage to the DUT 44 is adjusted by changing the pulse width modulation on a switching regulator (not shown) as is known in the art. Alternatively, the supply voltage could be adjusted by using a linear regulator.

Figure 3:
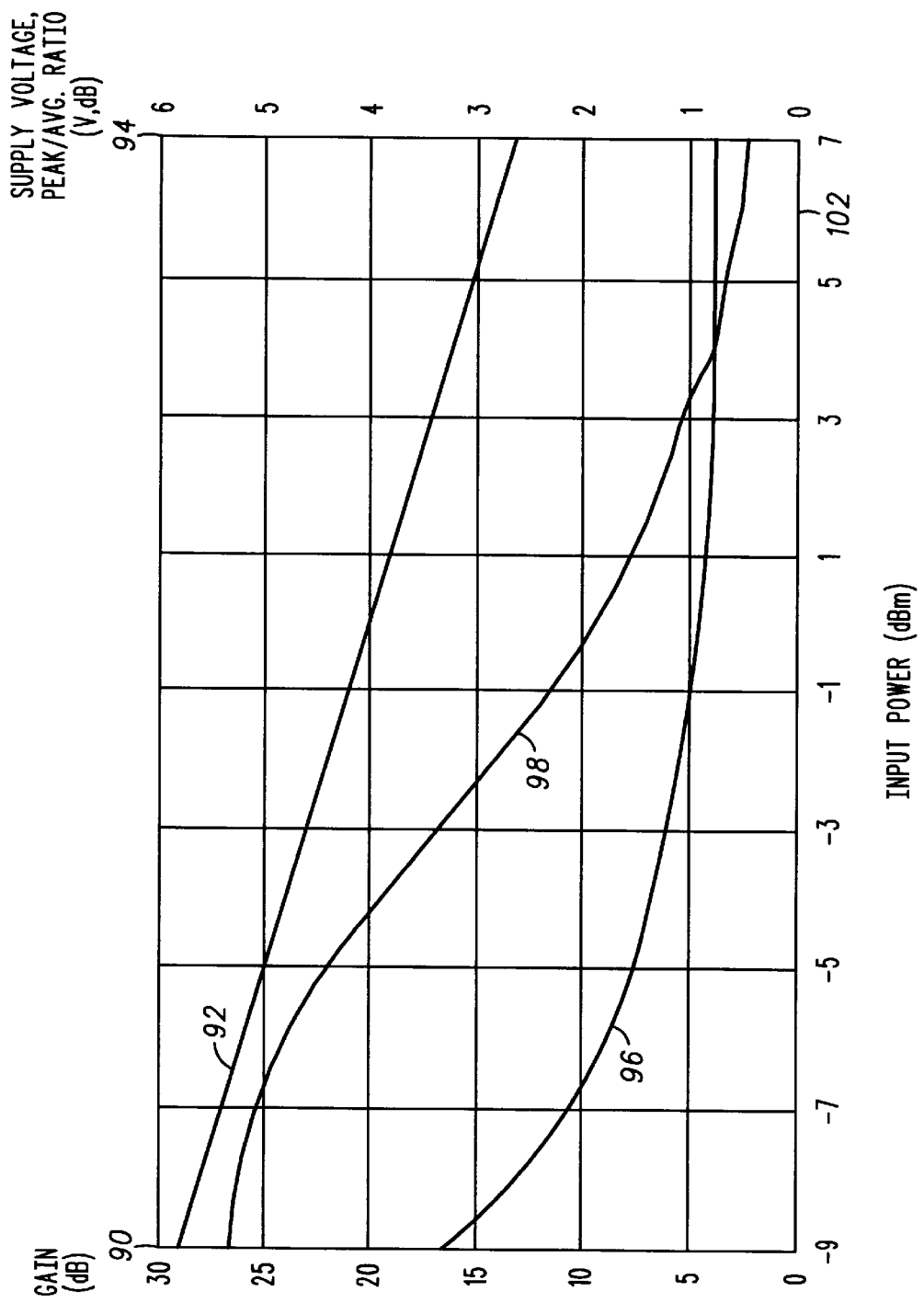
FIG. 3 is a plot of supply voltage, gain, and maximum peak-to-average power ratio over a finite time period, all versus input power, for the test setup of FIG. 2.

FIG. 3 is a plot of the supply voltage, DUT gain, and maximum instantaneous peak-to-average ratio over a finite time period, all versus input power. The left vertical axis 90 is the gain in dB of the DUT 44 that corresponds to gain curve 92. The right vertical axis 94 is the supply voltage in volts of the DUT 44 that corresponds to supply voltage curve 96. The right vertical axis 94 is also the maximum peak-to-average ratio in dB over a finite period of time and corresponds to peak-average curve 98. The horizontal axis 102 is input power in dBm.

FIG. 3 shows that it is possible to vary the supply voltage of the DUT 44 over a range of input powers to maintain a constant output power. For a linear increase in input power, there is a linear decrease in DUT 44 gain by varying the supply voltage to the DUT.

The peak-average curve 98 is a plot of the maximum peak-to-average ratio over a specified time interval. A peak hold measurement technique is used with the test equipment to detect the maximum instantaneous peak-to-average ratio at each input power and supply voltage setting. For example, the signal generator 40 (FIG. 2) produces an input signal that has OQPSK modulation similar to that used for the IS-95 CDMA cellular system. Therefore, the maximum instantaneous peak-to-average ratio of the input signal is 5.2 dB. When the DUT 44 is linear and does not introduce significant distortion, the measured maximum instantaneous peak-to-average ratio should be close to 5.2 dB.

For low input power (e.g. −9 dBm) and a supply voltage of 3.2V, the peak-average curve 98 shows that the DUT 44 is linear. This is evidenced by the fact that the maximum instantaneous peak-to-average ratio recorded at the −9 dBm input is approximately 5.2 dB; the DUT 44 introduces no distortion (e.g. peak signal clipping) at the low input power levels.

In addition, the peak-average curve 98 shows that as the input power to the DUT 44 is increased and the supply voltage of the DUT 44 is adjusted to maintain a constant output power, the maximum instantaneous peak-to-average ratio over a finite time period ratio monotonically decreases. That the peak-to-average ratio monotonically decreases here shows that a difference operation can be used in a control loop to set a desired maximum instantaneous peak-to-average ratio over a finite time period while maintaining control loop stability. These results are applicable to various output powers, different power amplifier designs using an identical semiconductor device, or even different power amplifier device technologies such as field effect transistors (FETs) or bipolar transistor technology.

Figure 4:
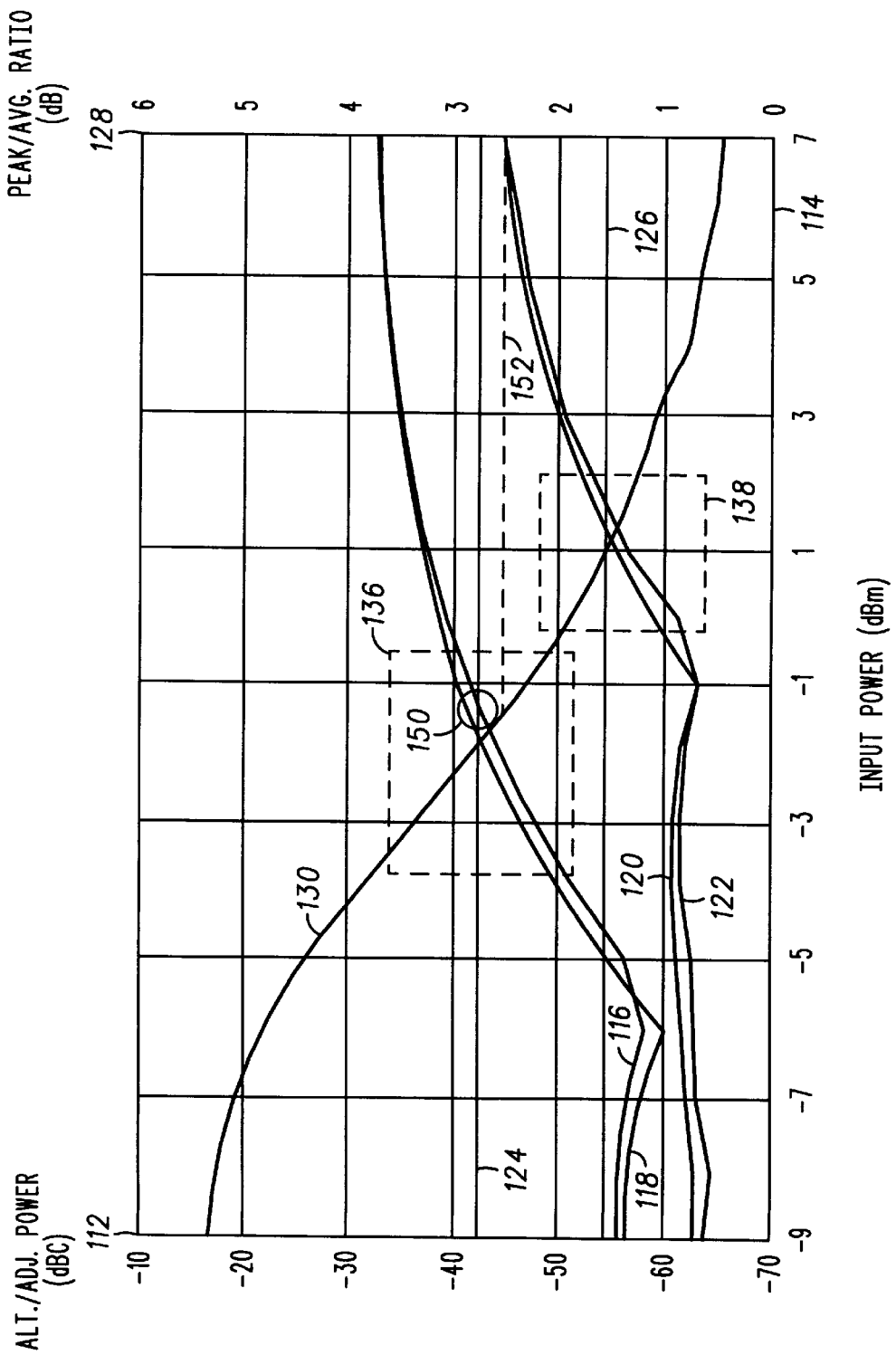
FIG. 4 is a plot of adjacent channel power, alternate channel power, and maximum peak-to-average power ratio over a finite time period, all versus input power, for the test setup of FIG. 2.

FIG. 4 is a plot of adjacent channel power, alternate channel power, and maximum instantaneous peak-to-average ratio over a finite time period, all versus input power. Once again the output power is held constant at 20 dBm by varying the supply voltage.

The left vertical axis 112 is the alternate and adjacent channel power in dBc of the DUT 44. The horizontal axis 114 is input power in dBm. AdjCP_Low curve 116 is the output adjacent channel power on the low side of the channel of operation. For example, the input signal channel of operation is set to 836 MHz. The adjacent channel power on the low side is then the power in a 30 kHz bandwidth 885 kHz below 836 MHz. Similarly, the AdjCP_high curve 118 is the output adjacent channel power 885 kHz above 836 MHz.

AltCP_low curve 120 is the output alternate channel power 1.98 MHz below 836 MHz. Similarly, AltCP_high curve 122 is the output alternate channel power 1.98 MHz above 836 MHz. Also shown in FIG. 4 is Adj_spec limit curve 124 corresponding to the adjacent channel power specification limit (−42 dBc) and Alt_spec limit curve 126 corresponding to the alternate channel power specification limit (−54 dBc), both in accordance to the IS-95 CDMA specification. Specification limits vary for different cellular standards.

The right vertical axis 128 is the maximum instantaneous peak-to-average ratio over a finite time period expressed in dB that corresponds to peak-average curve 130. Peak-average curve 130 is the same curve as peak-average curve 98 of FIG. 3 in that both curves represent the same data.

As the input drive is increased and the output power is maintained constant, the adjacent channel power and alternate channel power increases. Note that for adjacent channel and alternate channel powers less than approximately −55 dBc, the measurements are limited by test instrumentation limitations (e.g. dynamic range of spectrum analyzer 60 of FIG. 2 and spectral purity of signal generator 40). However, for data points close to where the adjacent and alternate channel powers intersect their specification limits, the adjacent channel and alternate channel power curves are monotonic.

Near region 136 of specification compliance for adjacent channel power and region 138 of specification compliance for alternate channel power, the maximum instantaneous peak-to-average ratio over a finite time period is inversely proportional to both the adjacent and alternate channel power. With this particular DUT 44, as the input power is increased, the specification limit for adjacent channel power is reached before the specification limit for alternate channel power is reached. Therefore, for the particular power amplifier used as the DUT 44, the maximum instantaneous peak-to-average ratio over a finite time period can be monitored to adjust the supply voltage to obtain a desired adjacent channel power, and that will also ensure specification compliance for alternate channel power.

Since the maximum instantaneous peak-to-average ratio over a finite time period can be predictably controlled, the adjacent channel power can be controlled as well. By controlling the maximum instantaneous peak-to-average ratio over a finite time period at the output of a power amplifier, the adjacent channel and alternate channel power are indirectly being controlled. This provides for an efficient and predictable manner of controlling the adjacent and alternate channel power.

As an example, for the IS-95 CDMA cellular system, the specification limit for adjacent channel power is −42 dBc. The crossover point 150 (FIG. 4) where the adjacent channel power crosses the specification limit corresponds to a maximum instantaneous peak-to-average ratio over a finite time period of approximately 2.6 dB, as shown by dotted line 152. Thus, for a transmitter using a power amplifier that comprises the DUT 44, the maximum instantaneous peak-to-average ratio over a finite time period is maintained at approximately 2.6 dB to keep both the adjacent and alternate channel output power within specification. To provide for some margin, the power amplifier circuit can maintain the maximum instantaneous peak-to-average ratio over a finite time period ratio at 2.8 dB or 3 dB.

Figure 5:
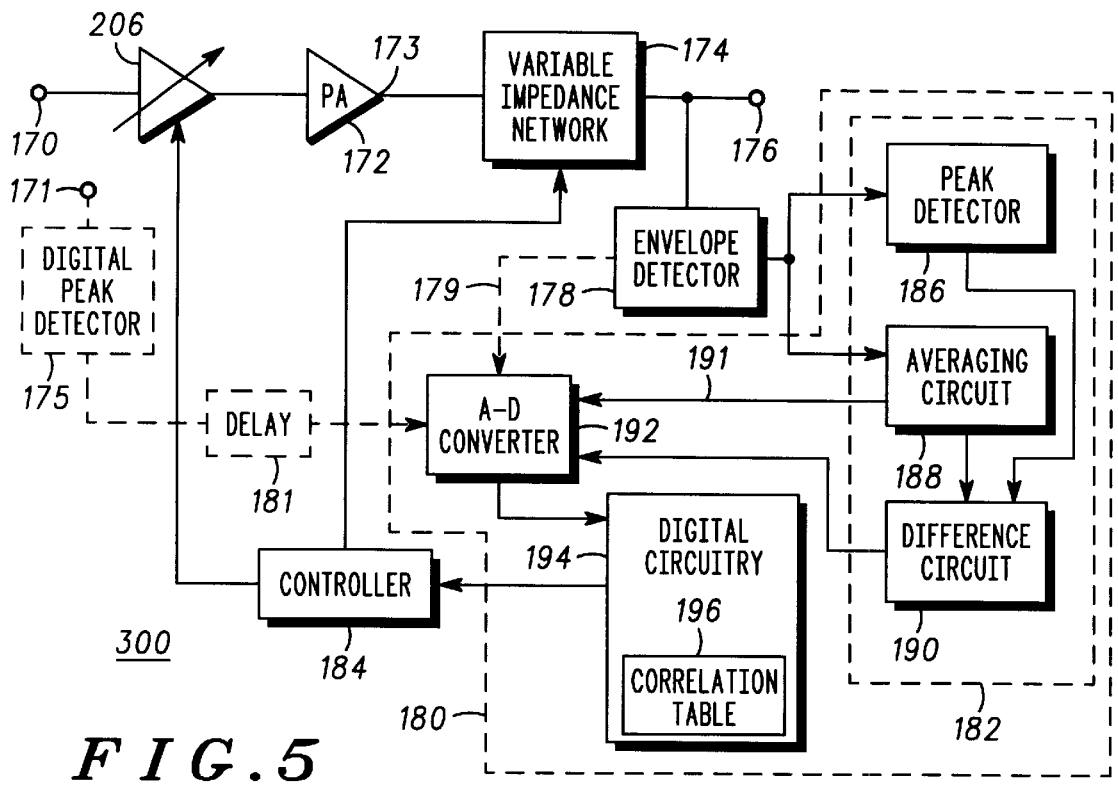
FIG. 5 is a block diagram of a power amplifying circuit for use in the transmitter of FIG. 1.

FIG. 5 is a block diagram of a power amplifying circuit 300 for use in the transmitter 16 (FIG. 1). The power amplifying circuit 300 includes a power amplifier 172 coupled to a variable impedance network 174 An envelope detector 178 is coupled to a power amplifier output 173. In the illustrated embodiment the envelope detector 178 is coupled to the output of the variable impedance network 174. The envelope detector 178 is coupled to a peak-toaverage detector 180, and the peak-to-average detector 180 is coupled to controller 184. The controller alternatively can be within the control block 20 (FIG. 1). The controller is coupled to the variable impedance network 174.

The peak-to-average detector includes a peak-to-average difference detector 182 coupled to an analog-to-digital converter (ADC) 192 and digital circuitry 194. The peak-to-average difference detector 182 includes a peak detector 186, an averaging circuit 188, and a difference circuit 190.

An RF input signal with modulation is applied to the power amplifier 172 through input 170. The power amplifier 172 produces an amplified signal at output 174. A portion of the amplified signal is coupled to the envelope detector 178.

The envelope detector serves to remove the RF carrier signal from the amplified signal. The resulting signal is applied to the peak-to-average difference detector 182. The peak-to-average difference detector 182 detects a peak level of the amplified signal and an average power of the amplified signal and provides an indication of the peak level and the average power over a predetermined period of time.

The peak detector 186 determines the peak level, and the average circuit 188 determines an average power 188. The difference circuit 190 determines the difference between the peak level and the average power to produce a difference signal. This sampling occurs at a low rate since the sampling is of an average value over a predetermined period of time. For example, for the IS-136 TDMA cellular system, the sampling occurs on the order of about 150 KHz (e.g. one average each burst), and for CDMA cellular systems, the sampling occurs on the order of approximately 20 KHz (one average each 50 μsec).

The difference signal is applied to the ADC 192 for conversion to digital samples, also referred to as a digital word. The digital word is compared to a difference correlation table 196 within the digital circuitry 194. Thus, depending upon the peak-to-average difference, a resulting peak-to-average ratio is produced by the digital circuitry 194. The digital circuitry contains conventional logic circuitry and state machines as is known in the art. Alternatively, the comparison to the correlation table can be implemented with a digital signal processor (DSP) or microprocessor.

The resulting peak-to-average ratio is applied to the controller 184. The controller 184 produces a load control signal, responsive to the indication of the difference between the peak level and the average power of the amplified signal, that is applied to the variable impedance network 174. The variable impedance network 174 presents different impedances to the power amplifier output 173 responsive to the indication of the difference between the peak level and the average power of the amplified signal (e.g. responsive to the load control signal). The impedance presented to the power amplifier output 173 is adjusted until the peak-to-average ratio of the amplified signal appearing at output 176 is substantially equal to a predetermined level. In other words, the impedance is adjusted until the actual peak-to-average ratio is substantially equal to a desired peak-to-average ratio. By maintaining a peak-to-average ratio of the amplified signal, the power amplifying circuit 300 also controls the adjacent channel power and alternate channel power radiated emissions.

The power amplifying circuit 300 can optionally include circuitry to control the average output power. The average output power of the transmitter 16 (FIG. 1) varies according to a changeable desired average output power, and the controller causes the variable impedance network 174 to present the different impedances to the power amplifier output 173 over only a portion of a total dynamic range of the average output power.

A variable gain circuit, here variable gain amplifier 206, couples the input 170 to the input of the power amplifier 172. The averaging circuit 188 produces an indication on line 191 of the average output power. The ADC 192 converts the indication of the average output power to a digital signal, and the digital circuitry 194 applies the digital signal to the controller 184. The controller 184 produces a gain control signal that is applied to the VGA 206 to control the gain of the VGA 206, thereby maintaining a desired average output power.

Figure 6:
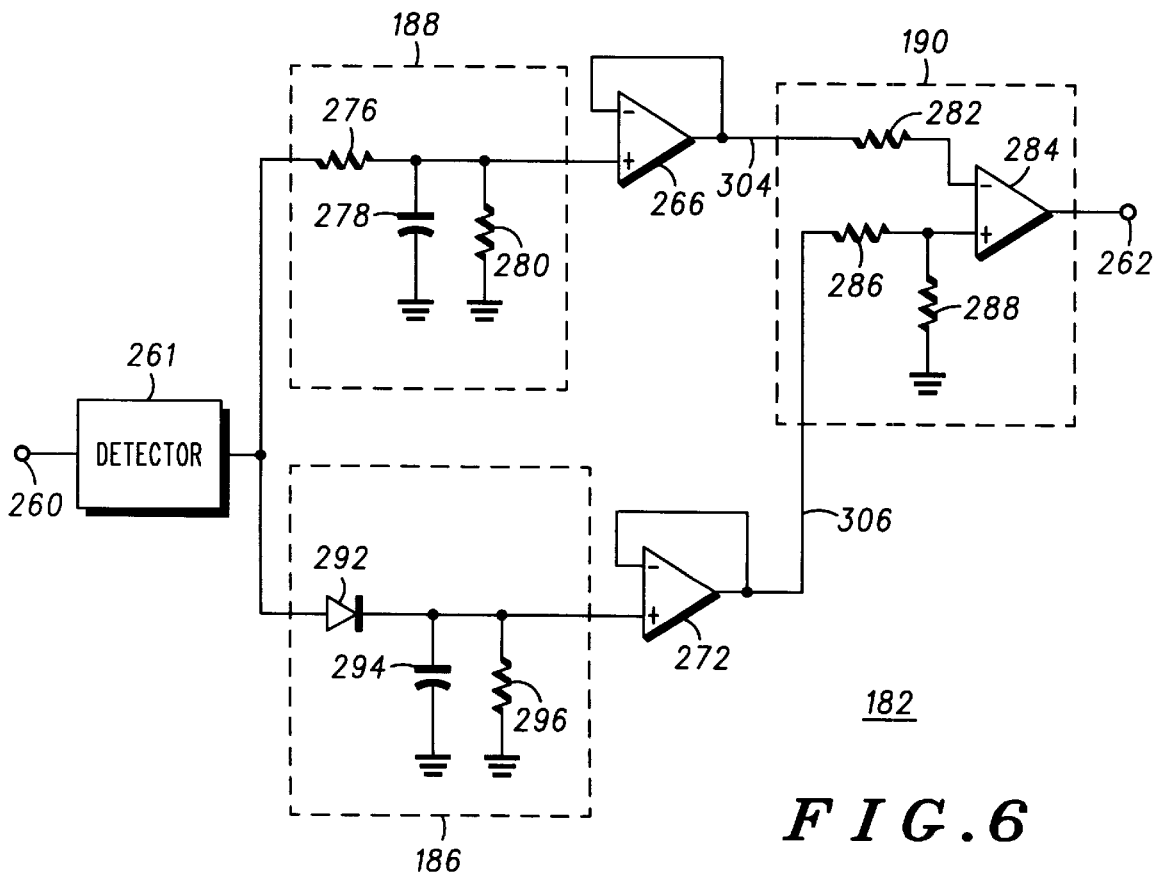
FIG. 6 is a block diagram of a peak-to-average difference detector for use in the power amplifying circuit of FIG. 5.

FIG. 6 is an example embodiment of a peak and difference detector 182 used in conjunction with the peak-to-average detector 180 (FIG. 5). The peak and difference detector 182 includes an averaging circuit 188, a first op-amp 266, a difference circuit 190, a peak detector 186, and a second op-amp 272.

The averaging circuit 188 includes a series resistor 276 coupled to a shunt capacitor 278 and a shunt resistor 280. The peak detector 188 includes a diode detector 292 coupled to a shunt capacitor 294 and a shunt resistor 296.

The difference circuit 190 has a first input 304 coupled through a series resistor 282 to the negative input of an op-amp 284. A second input 306 is coupled through a series resistor 286 and a shunt resistor 288 to a positive input of the op-amp 284. The output of the op-amp 284 is the peak and difference detector output 262.

The envelope signal produced by envelope detector 178 (FIG. 5) is applied to peak and difference detector input 260. The envelope signal is applied to the averaging circuit 188 and the peak detector 186. The peak of the envelope signal is produced by the peak detector 186, whereas an average value of the envelope signal is produced by the averaging circuit 188.

First op-amp 266 and second op-amp 272 are voltage followers to provide isolation between the averaging circuit 188 and the difference circuit 190 and between the peak detector 186 and the difference circuit 190. The buffered average value is applied to first input 304 and the buffered detected peak of the signal is applied to second input 306. The difference between the peak and average signal is produced at output 262.

In an alternate embodiment of the power amplifying circuit of FIG. 5, the peak and difference detector 182 does not include the difference circuit 190. Instead, the peak detector 186 and the averaging circuit 188 are sampled directly via the ADC 192. Either the digital circuitry 194 or the controller 184 then calculates a peak-to-average ratio. This alternate embodiment thus removes the need for a correlation table 196 and a simplified circuit configuration. For sufficiency dynamic range on the order of 20 dB using a single peak detector 186 and a single averaging circuit 188, the ADC 192 must have high resolution on the order of twelve bits.

In yet another alternate embodiment of the power amplifying circuit of FIG. 5, the peak-to-average detector 180 does not include a peak and difference detector 182. Instead, the envelope signal produced by the envelope detector 178 is applied directly via line 179 to the ADC 192. The peak-to-average ratio is calculated with software. In the IS-136 TDMA cellular telephone system, the ADC 192 must sample the envelope signal at approximately 50 KHz. For the IS-95 CDMA cellular system, the ADC 192 must sample the envelope signal at approximately 2.5 MHz.

When the ADC 192 directly samples the detected baseband signal produced by the envelope detector 178, the power amplifying circuit can include an optional baseband digital peak detector 175 to eliminate the need for the higher sampling rates. The transmitter 16 (FIG. 1) contains digital baseband circuitry for receiving an information signal and producing a digital I-Q stream (e.g. via an encoder, not shown, as is known in the art). The transmitter 16 (FIG. 1) further includes conventional transmitter circuitry (also not shown) for converting the digital stream into an radio frequency (RF) input signal as is known in the art. For example, the transmitter circuitry includes frequency conversion mixers, quadrature modulators, and filters.

The digital peak detector 175 monitors via port 171 the digital stream produced by the digital baseband circuitry (not shown) to determine when a peak in the RF input signal is to occur. The digital peak detector 175 produces a peak indication signal that is applied to the delay block 181. The delay block is digital delay circuitry to account for the delay that the digital stream will experience as it travels through the transmitter 16 (FIG. 1) and is produced at the output 176 (FIG. 5). The delayed signal is applied to sample and hold circuitry of the ADC 192 to trigger the ADC 192 to sample the peak at the appropriate time. The ADC 192 then produces the digital peak value.

The digital peak detector 175 comprises digital logic that can be implemented in an application specific integrated circuit (ASIC). The digital peak detector 175 monitors the IQ bit stream for a bit pattern known a priori to cause a peak amplitude in the envelope produced by envelope detector 178. The digital peak detector function can also be implemented via software or can be performed via the controller 184 (FIG. 5). An example of monitoring the digital baseband signal for peaks is described in a co-pending U.S. patent application entitled "DIGITAL MODULATOR WITH COMPENSATION," Ser. No. 08/694,004, filed Aug. 8, 1996, assigned to the assignee of the present invention, the disclosure thereof incorporated by reference.

Figure 7:
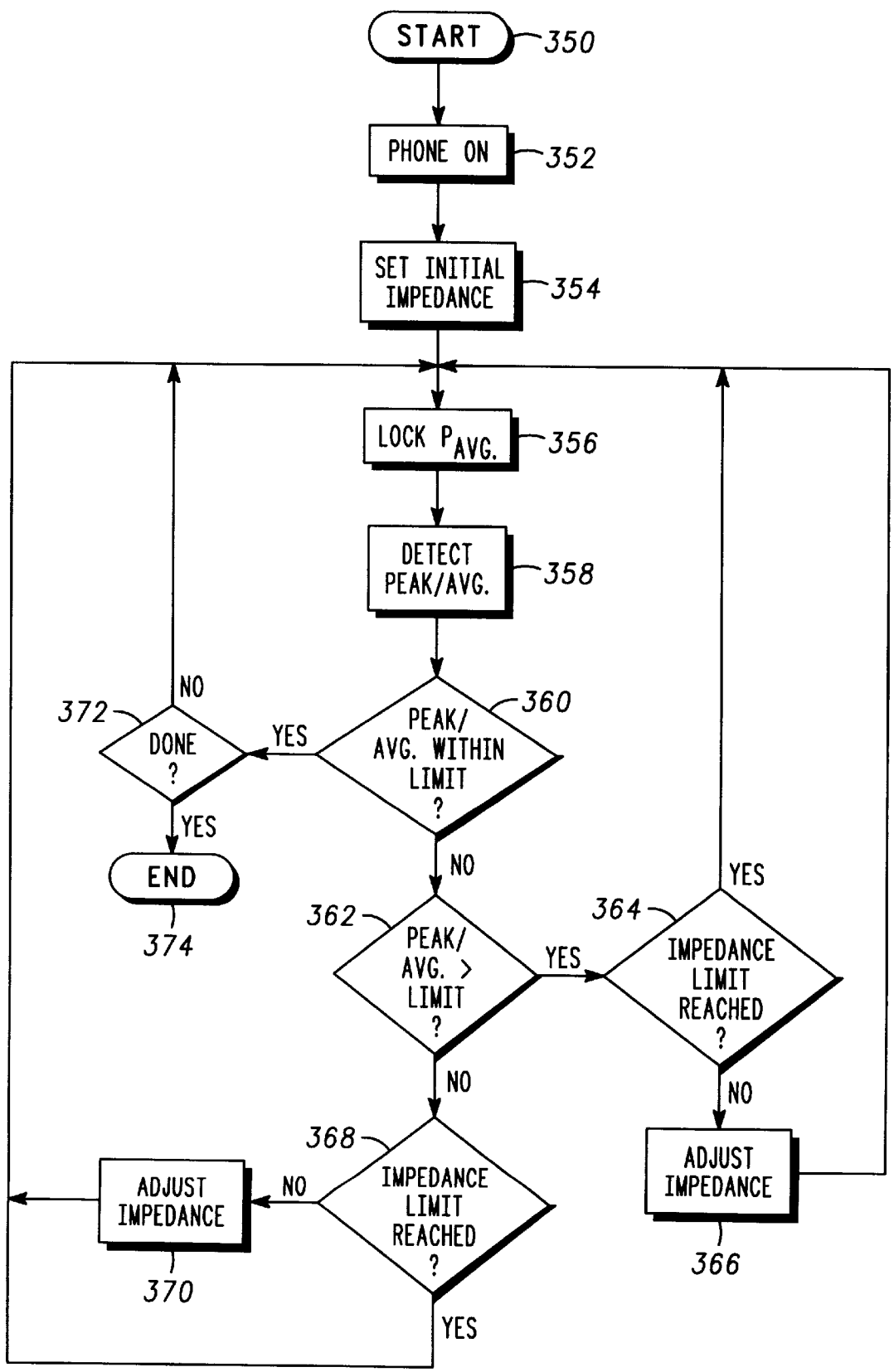
FIG. 7 shows a method of amplifying an RF signal.
Figure 9:
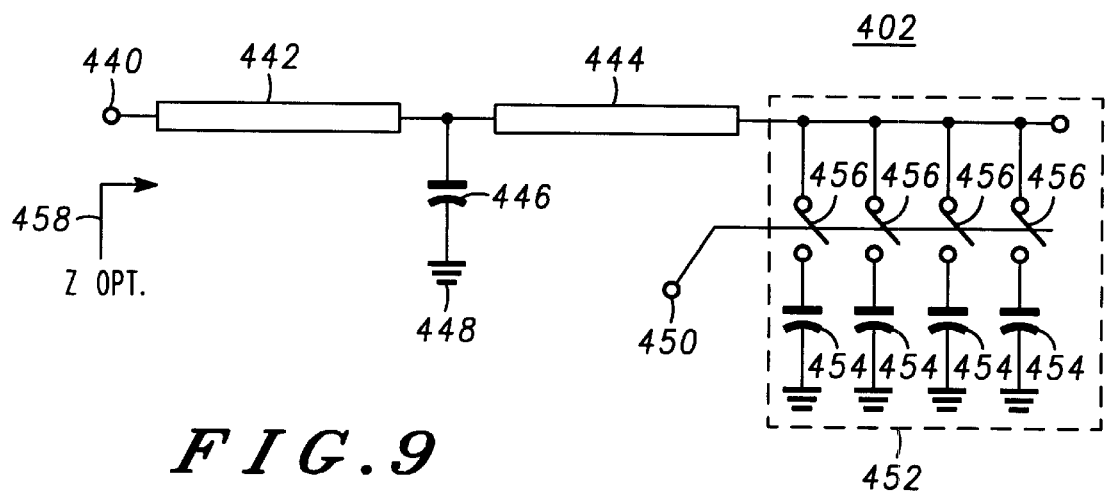
FIG. 9 shows a second embodiment variable impedance network.

FIG. 7 shows a flow chart illustrating a method of amplifying an RF signal. The method starts at block 350, and at block 352 the portable radiotelephone 12 (FIG. 1) is turned on. The variable impedance network 174 (FIG. 5) is set to an initial impedance at block 354. This can be done by, for example, sending the digital word 0000 to the variable impedance network 402 (FIG. 9). This initial impedance is a starting point impedance that is known to cause the portable radiotelephone to pass adjacent and alternate channel power specifications.

At block 356 the desired average power is chosen and the gain of the VGA 206 (FIG. 5) is set to achieve the desired average power. The output power loop is kept locked by constantly monitoring the average output power and adjusting the gain of the VGA 206 (FIG. 5) to maintain a desired average output power.

At block 358 the peak-to-average ratio of the amplified signal is detected, and it is determined at decision block 360 as to whether the detected peak-to-average ratio is within a predetermined level or limit. If the detected peak-to-average ration is within a predetermined level, it is determined whether the method is done at decision block 372 (e.g. transmission of signal is complete). If the method is done, the method ends at block 374; otherwise, the method continues at block 356.

The predetermined level is a predetermined peak-to-average ratio known to correspond to any of a certain alternate channel radiated power and a certain adjacent channel radiated power. For example, in an IS-95 CDMA portable radiotelephone, the predetermined peak-to-average ratio can be approximately 3 dB.

If it is determined at decision block 360 that the peak-to-average ratio is not close enough to the predetermined level (e.g. within plus or minus a predetermined amount of the predetermined level, such as within +/−0.5 dB), then at decision block 362 it is determined if the detected peak-to-average ratio is greater than the predetermined level. If the detected peak-to-average ratio is greater than the predetermined level, then it is determined at decision block 364 whether the variable impedance network 174 (FIG. 5) has any more impedance adjustment range remaining to present a different impedance to the power amplifier output 173 (FIG. 5).

If there is no more dynamic range available from the variable impedance network 174 (FIG. 5), the existing setting of the variable impedance network 174 is maintained, and the process continues at block 356. For example, if the current digital word applied to the variable impedance network 402 (FIG. 9) is 1111, there is no more states available to increment the variable impedance network 174 (FIG. 5).

If there is more dynamic range available (e.g. the current digital word is <1111), then at block 366 the load control signal is changed to adjust the variable impedance network 174 (FIG. 5). For example, for the variable impedance network 402 (FIG. 9), adjusting the variable impedance network 402 comprises incrementing the digital control word (e.g. load control signal) to a higher state, such as from 1110 to 1111. The method then continues at block 356.

If it is determined at block 362 that the detected peak-to-average ratio is less than the predetermined level, then at block 368 it is determined if there is any dynamic range left in the variable impedance network 174 (FIG. 5). For example, in FIG. 9 if the load control signal to the variable impedance network 402 is currently at 0000, then the load control signal cannot be decremented any lower. If there is no dynamic range remaining, the existing setting of the variable impedance network 174 (FIG. 5) is maintained, and the process continues at block 356.

If there is more dynamic range available with the variable impedance network 174 (FIG. 5), then the load control signal is changed at block 370 to adjust the variable impedance network 174. For example, for the variable impedance network 402 (FIG. 9), adjusting the variable impedance network 402 comprises decrementing the digital control word (e.g. load control signal) to a lower state, such as from 0001 to 0000. The method then continues at block 356.

Figure 8:
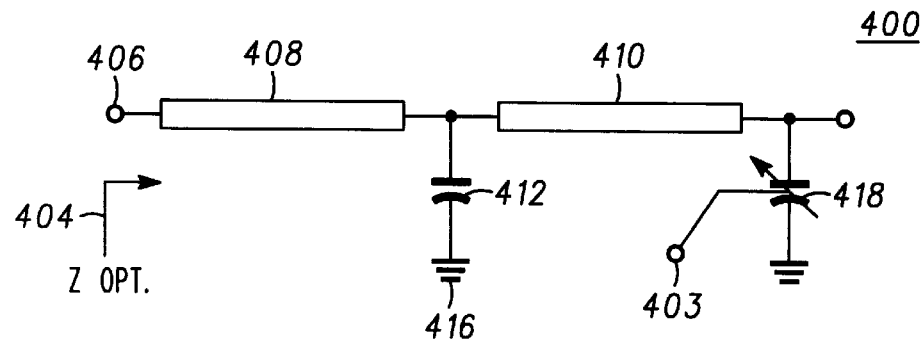
FIG. 8 shows a variable impedance network that can be used in the power amplifying circuit of FIG. 5.

FIG. 8 shows a first embodiment variable impedance network 400 that can be used to present various impedances to the power amplifier 172 (FIG. 5). The variable impedance network 400 includes first transmission line 408, fixed shunt capacitor 412 coupled to ground potential 416, second transmission line 410, and at least one variable element 418 coupled to ground potential 416. The variable element 418 can be selected from the group consisting of a varactor diode and a voltage variable capacitor. The load control signal is applied to input 403 as a voltage to vary the capacitance of the variable element 418. Arrow 404 shows that the impedance presented at input 406 is maintained to be substantially the optimum impedance for the power amplifier 172 (FIG. 5) for the various output power levels. The controller 184 (FIG. 5) produces an analog voltage as the load control signal. Thus, the controller can include a digital-to-analog converter (DAC) to produce the analog signal.

Other configurations of the variable impedance network 400 can be envisioned. For example, additional elements can be included, such as lumped element or distributed element inductors, additional transmission lines and capacitors, and additional variable elements.

FIG. 9 shows a second embodiment variable impedance network 402. The variable impedance network 402 includes first transmission line 442, a fixed shunt capacitor 446 coupled to ground potential 448, second transmission line 444, and at least one variable element 452 coupled to ground potential 448. The at least one variable element 452 comprises a plurality of capacitors 454 alternatively coupled and uncoupled to the power amplifier output 173 (FIG. 5) using PIN diodes or micro-mechanical switches. The load control signal is applied to input 450 to open and close a plurality of switches 456 coupling the plurality of capacitors 454 to the power amplifier output 173 (FIG. 5). Arrow 458 shows that the impedance presented at input 440 is maintained.

In the illustrated embodiment the controller 184 (FIG. 5) produces a four bit digital control signal to control the plurality of switches 456. The controller can include a shift register (not shown) to convert the digital control word to a four bit parallel word as the load control signal. In another embodiment, the shift register can be on a multi-chip module along with the power amplifier 173 (FIG. 5). Therefore, for the variable impedance network 402, sixteen different impedances are possible.

Thus, the variable impedance network has at least one variable element. The variable element can be selected from the group consisting of a varactor diode, a voltage variable capacitor, and a plurality of capacitors alternatively coupled and uncoupled to the output of the signal amplifier using micro-electromechanical switches or PIN diodes.

Other configurations of the variable impedance network 402 can be envisioned without the use of the inventive faculty. For example, additional elements can be included, such as lumped element or distributed element inductors, additional transmission lines and capacitors, and additional variable elements. A combination of the variable impedance network 400 and the variable impedance network 402 could be used to increase the range of obtainable impedances. In addition, the load control signal can comprise multiple signals to separately control different variable impedance elements.

Figure 10:
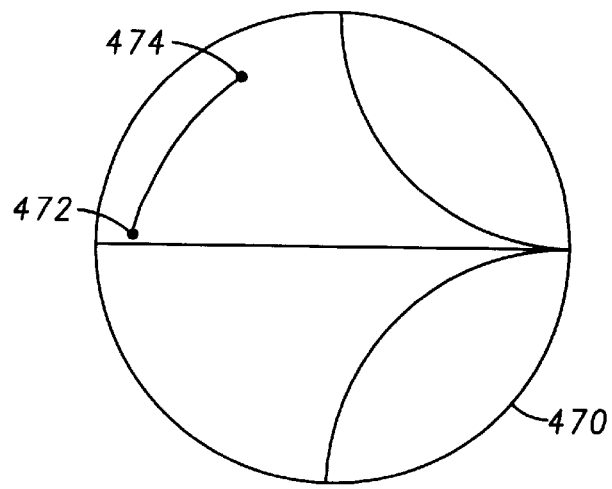
FIG. 10 is a plot of impedances for the variable impedance network.

FIG. 10 is a Smith chart 470 showing the range of impedance states corresponding, for example, to the variable impedance network 402 (FIG. 9). First impedance state 472, also referred to as an initial impedance state, corresponds to a load control signal of 0000. The last impedance state 474 corresponds to a load control signal of 1111.

The previous description of the preferred embodiments are provided to enable any person skilled in the art to use or make the power amplifying circuit with load adjust. Various modifications to these embodiments will be readily apparent to those skilled in the art, and the generic principles defined herein may be applied to other embodiments without the use of the inventive faculty. For example, the power amplifying circuit can be used with a transmitter that operates on more than one frequency band. The load will be adjusted based on the peak to average ratio in conjunction with the frequency band of operation (e.g. different desired peak-to-average ratios).

The power amplifying circuit provides for a highly effective way of improving the efficiency of a power amplifier while maintaining necessary adjacent channel and alternate channel power performance. The adjacent and alternate channel power can result substantially from a power amplifier. Alternatively, the adjacent and alternate channel power can result from other transmitter circuitry that precedes the power amplifier in the transmit path. The power amplifying circuit also allows for control of adjacent and alternate channel power over part-to-part variations present in portable radiotelephones.

We claim:

1. A power amplifying circuit comprising:
   a power amplifier for amplifying an input signal to produce an amplified signal;
   a variable impedance network coupled to an output of the power amplifier, the variable impedance network for presenting different impedances to the output of the power amplifier responsive to a load control signal;
   a peak-to-average difference detector coupled to an output of the power amplifier, the peak-to-average difference detector to detect a peak level of the amplified signal and an average power of the amplified signal and to provide an indication of a difference between the peak level and the average power; and
   a controller coupled to the peak-to-average difference detector and the variable impedance network, the controller for producing the load control signal responsive to the indication of the difference between the peak level and the average power of the amplified signal.

2. The power amplifying circuit as in claim 1 wherein the controller causes the variable impedance network to present different impedances to the output of the power amplifier to maintain the difference between the peak level and the average power substantially equal to a predetermined level.

3. The power amplifying circuit as in claim 2 wherein the controller determines a peak-to-average ratio of the amplified signal based upon the indication of the difference between the peak level and the average power, the controller to produce the load control signal responsive to the peak-to-average ratio.

4. The power amplifying circuit as in claim 1 wherein the average output power varies according to a changeable desired average output power, the controller causing the variable impedance network to present the different impedances to the output of the power amplifier over only a portion of a total dynamic range of the average output power.

5. The power amplifying circuit as in claim 1 further comprising a variable gain circuit coupled to an input of the power amplifier, wherein the controller adjusts a gain of the variable gain circuit responsive to the indication of the average power to cause the average power to substantially equal a desired average output power.

6. The power amplifying circuit as in claim 1 wherein the peak-to-average difference detector detects the peak level and the average power of the amplified signal over a predetermined time period.

7. A power amplifying circuit comprising:
   a power amplifier for amplifying an input signal to produce an amplified signal;
   a variable impedance network coupled to an output of the power amplifier, the variable impedance network for presenting different impedances to the output of the power amplifier responsive to a load control signal;
   a peak-to-average detector coupled to an output of the power amplifier, the peak-to-average detector to provide an indication of a peak-to-average ratio of the amplified signal; and
   a controller coupled to the peak-to-average detector and the variable impedance network, the controller for producing the load control signal responsive to the indication of the peak-to-average ratio of the amplified signal.

8. The power amplifying circuit as in claim 7 wherein the controller causes the variable impedance network to present different impedances to the output of the power amplifier to cause the peak-to-average ratio of the amplified signal to substantially equal a predetermined level.

9. The power amplifying circuit as in claim 7 wherein the average output power varies according to a changeable desired average output power, the controller causing the variable impedance network to present the different impedances to the output of the power amplifier over only a portion of a total dynamic range of the average output power.

10. The power amplifying circuit as in claim 7 further comprising a variable gain circuit coupled to an input of the power amplifier, wherein the peak-to-average detector provides an indication of an average output power, the controller to adjust a gain of the variable gain circuit responsive to the indication of the average power to cause the average power to substantially equal a desired average output power.

11. The power amplifying circuit as in claim 7 wherein the peak-to-average detector detects the peak-to-average ratio of the amplified signal over a predetermined time period.

12. A transmitter operable in a portable radiotelephone, the transmitter comprising:
   digital baseband circuitry for receiving an information signal and producing a digital stream;
   transmitter circuitry for converting the digital stream into an radio frequency (RF) input signal;
   a power amplifying circuit including:
      a power amplifier for amplifying the RF input signal to produce an amplified signal;
      a variable impedance network coupled to an output of the power amplifier, the variable impedance network for presenting different impedances to the output of the power amplifier responsive to a load control signal;
      a digital peak detector coupled to the digital baseband circuitry, the digital peak detector for determining when a peak in the RF input signal is to occur and producing a peak indication signal;
      a peak-to-average detector coupled to an output of the power amplifier and responsive to the peak indication signal, the peak-to-average detector to provide an indication of a peak-to-average ratio of the amplified signal; and
      a controller coupled to the peak-to-average detector and the variable impedance network, the controller for producing the load control signal responsive to the indication of the peak-to-average ratio of the amplified signal.

13. The transmitter as in claim 12 wherein the peak-to-average detector comprises:
   an envelope detector coupled to the output of the power amplifier to remove an RF carrier signal from the amplified signal to produce an envelope signal;
   an analog-to-digital converter (ADC) coupled to the envelope detector, the ADC for converting the envelope signal into digital samples; and
   digital circuitry coupled to receive the digital samples and produce an indication of the peak-to-average ratio of the amplified signal.

14. The transmitter as in claim 13 wherein one of the digital samples is an indication of a peak level of the amplified signal, the indication of the peak level produced by the ADC responsive to the peak indication signal.

15. The transmitter as in claim 14 wherein the ADC includes a sample-and-hold circuit, the sample-and-hold circuit triggered by the peak indication signal to capture a sample of the envelope signal, the ADC converting the sample of the envelope signal to the indication of the peak level.

16. The transmitter as in claim 15 wherein the peak indication signal is delayed to account for propagation delay in the transmitter circuitry.

17. The transmitter as in claim 16 further comprising a variable gain circuit coupled to an input of the power amplifier, wherein the peak-to-average detector provides an indication of an average output power, the controller to adjust a gain of the variable gain circuit responsive to the indication of the average output power to cause the average output power to substantially equal a desired average output power.

18. A method of amplifying a radio frequency (RF) signal, the method comprising:
   amplifying the RF signal with a power amplifier to produce an amplified signal;
   detecting a peak-to-average ratio of the amplified signal;
   producing an indication of the peak-to-average ratio; and
   changing impedances presented to an output of the power amplifier responsive to the indication of the peak-to-average ratio.

19. The method as in claim 18 wherein the impedances presented to the output of the power amplifier cause the peak-to-average ratio of the amplified signal to substantially equal a desired peak-to-average ratio.

20. The method as in claim 19 wherein an average output power of the amplified signal varies according to a changeable desired average output power, the impedances presented to the output of the power amplifier changing over only a portion of a total dynamic range of the average output power.

21. A power amplifying circuit comprising:
   a power amplifier for amplifying an input signal to produce an amplified signal;
   a variable impedance network coupled to an output of the power amplifier, the variable impedance network for presenting different impedances to the output of the power amplifier responsive to a load control signal;
   a peak-to-average difference detector coupled to an output of the power amplifier, the peak-to-average difference detector to detect a peak level of the amplified signal and an average power of the amplified signal and to provide an indication of a difference between the peak level and the average power;
   a controller coupled to the peak-to-average difference detector and the variable impedance network, the controller for producing a digital control signal responsive to the indication of the difference between the peak level and the average power of the amplified signal; and
   a shift register coupled to the controller and the variable impedance network, the shift register to convert the digital control signal to the load control signal.

* * * * *